United States Patent
Tsuji et al.

(10) Patent No.: US 8,232,832 B2
(45) Date of Patent: Jul. 31, 2012

(54) VOLTAGE ADDER CIRCUIT AND D/A CONVERTER CIRCUIT

(75) Inventors: Nobuaki Tsuji, Hamamatsu (JP); Toshio Maejima, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 45 days.

(21) Appl. No.: 12/928,529

(22) Filed: Dec. 14, 2010

(65) Prior Publication Data

US 2011/0140941 A1    Jun. 16, 2011

(30) Foreign Application Priority Data

Dec. 16, 2009 (JP) ................... 2009-285063

(51) Int. Cl.
*G06G 7/14* (2006.01)
(52) U.S. Cl. ......... 327/361; 330/257; 327/276; 365/163
(58) Field of Classification Search .......... 341/140–160; 323/288; 365/163, 148, 211; 345/94, 204; 330/69, 257, 255, 300; 327/361, 276
See application file for complete search history.

(56) References Cited

U.S. PATENT DOCUMENTS

| | | | | |
|---|---|---|---|---|
| 6,348,818 B1 * | 2/2002 | Filipovski | ...................... | 327/108 |
| 7,061,326 B2 * | 6/2006 | Kikuchi | ......................... | 330/285 |
| 7,113,424 B2 * | 9/2006 | Happ et al. | ..................... | 365/163 |
| 7,176,869 B2 * | 2/2007 | Kumada et al. | ................. | 345/94 |
| 7,327,623 B2 * | 2/2008 | Happ et al. | ..................... | 365/211 |
| 7,859,894 B2 * | 12/2010 | Happ et al. | ..................... | 365/163 |

FOREIGN PATENT DOCUMENTS

JP    A-2001-156640    8/2001

* cited by examiner

*Primary Examiner* — Lam T Mai
(74) *Attorney, Agent, or Firm* — Pillsbury Winthrop Shaw Pittman LLP

(57) ABSTRACT

A voltage adder circuit includes an amplifier circuit having a first operational amplifier and into which a first voltage is input, a circuit that supplies an output current to the amplifier circuit, and a current providing section that detects the output current of the circuit and supplies an output current equal to the output current of the circuit in magnitude so that the output current of the circuit is prevented from inputting to or outputting from the first operational amplifier through an output terminal of the first operational amplifier. A second voltage is input into the circuit.

4 Claims, 3 Drawing Sheets

VOLTAGE ADDER CIRCUIT AND D/A CONVERTER CIRCUIT

BACKGROUND

The present invention relates to a voltage adder circuit that subjects a plurality of input voltages to weighted addition and a D/A converter circuit provided with the voltage adder circuit.

In some D/A converter circuits, input data that are an object of conversion are divided into high-order bits and low-order bits, and the high-order bits and the low-order bits are respectively subjected to D/A conversion. Respective results of D/A conversions are further subjected to weighted addition, whereby a final result of D/A conversion is produced. A D/A converter circuit of this type is described in; for instance, JP-A-2001-156640. The D/A converter circuit has two D/A converters and a voltage adder circuit. The two D/A converters perform D/A conversion of high-order four bits, among eight bits of input data, and a result of bit inversion of low-order four bits (i.e., one's complement of the low-order four bits). A voltage adder circuit subjects a voltage Va and a voltage Vb output from the two D/A converters to weighted addition. As shown in FIG. 3A, the D/A converter circuit described in JP-A-2001-156640 us es, as a voltage adder circuit that performs weighted addition of the voltage Va and the voltage Vb, a voltage adder circuit including two operational amplifiers OP1 and OP2 and two resistors ra and rb. In the voltage adder circuit, the resistors ra and rb are interposed between an output terminal OUT of the operational amplifier OP1 and an output terminal OUT of the operational amplifier OP2. The output terminal OUT of the operational amplifier OP1 is connected to a negative input terminal IN− of the same by way of the resistor ra, and the output terminal OUT of the operational amplifier OP2 is connected to a negative input terminal IN− of the same by bypassing the resistor. In such a configuration, a resistance ratio of the resistor ra to the resistor rb is taken as 1 to $(2^n-1)$, the voltage Va is input to a positive input terminal IN+ of the operational amplifier OP1, and the voltage Vb is input to a positive input terminal IN+ of the operational amplifier OP2. A voltage Vo equal to a result of weighted addition operation expressed by the following equation is output from the output terminal OUT of the operational amplifier OP1. The voltage Vo ideally comes to a voltage that linearly changes in response to the original 8-bit input data.

$$Vo = (2^n/(2^n-1))Va - (1/(2^n-1))Vb \quad (1)$$

However, in the voltage adder circuit having such a configuration, when a difference occurs between a voltage of the output terminal OUT of the operational amplifier OP1 and a voltage of the output terminal OUT of the operational amplifier OP2, an electric current flows between the output terminals OUT. As a result, an input offset voltage occurs between the positive input terminal IN+ and the negative input terminal IN− of the operational amplifier OP1, as well as occurring between the positive input terminal IN+ and the negative input terminal IN− of the operational amplifier OP2. In particular, the input voltage Va of the operational amplifier OP1 is multiplied by a large weighting coefficient $(2^n/(2^n-1))$ as expressed by Equation (1). The input offset occurred in the operational amplifier OP1 adversely affects a voltage Vo obtained from the output terminal OUT of the operational amplifier OP1, which in turn induces an error between an actually acquired voltage value Vo and an ideal voltage value Vo represented by Equation (1). An explanation is hereunder given to why the input offset occurs in the operational amplifier OP1.

FIG. 3B shows an example configuration of the operational amplifier OP1 and that of the operational amplifier OP2 used in the voltage adder circuit shown in FIG. 3A. In FIG. 3B, a gate of an N channel field effect transistor (hereinafter called simply as a "transistor") N1 acts as the positive input terminal IN+ of the operational amplifier OP1 (OP2). A gate of an N channel transistor N2 serves as a negative input terminal IN− of the operational amplifier OP1 (OP2). Sources of the respective N channel transistors N1 and N2 are connected together, thereby forming a differential pair that amplifies a potential difference between the positive input terminal IN+ and the negative input terminal IN−. A drain of an N channel transistor N3 is connected to a common node between the sources of the N channel transistors N1 and N2, and a source of the N channel transistor N3 is connected to a ground. A reference level voltage Vref having a given reference level is applied to a gate of the N channel transistor N3 and acts as a constant current source that supplies a constant current having a given current value Iref. A drain of the P channel transistor P1 is connected to a drain of the N channel transistor N1, and a drain of the P channel transistor P2 is connected to a drain of the N channel transistor N2. Sources of the P channel transistors P1 and P2 are connected to a power source VDD, and respective gates of the P channel transistors P1 and P2 are connected to a drain of the N channel transistor N2, thereby acting as loads for the respective N channel transistors N1 and N2.

A source of the P channel transistor P3 is connected to the power source VDD, and a gate of the P channel transistor P3 is connected to a node between a drain of the N channel transistor N1 and a drain of the P channel transistor P1. A source of an N channel transistor N4 is connected to the ground, and a drain of the N channel transistor N4 is connected to a drain of a P channel transistor P3. The reference level voltage Vref is applied to a gate of the N channel transistor N4. The N channel transistor N4 acts as a constant current source that lets the given current Iref flow. A node between a drain of the P channel transistor P3 and a drain of the N channel transistor N4 acts as the output terminal OUT of the operational amplifier OP1 (OP2).

In the configuration shown in FIG. 3A, when one of a voltage of the output terminal OUT of the operational amplifier OP1 and a voltage of the output terminal OUT of the operational amplifier OP2 becomes higher than the other, an electric current flows from the output terminal OUT having a higher voltage toward the output terminal OUT having a lower voltage.

For instance, an electric current $\Delta I$ having a certain magnitude is assumed to flow from the operational amplifier OP1 to the operational amplifier OP2. In this case, in order to output the current $\Delta I$ from the output terminal OUT of the operational amplifier OP1 shown in FIG. 3B, a drain current flowing into the P channel transistor P3 must become higher than the current value Iref of the N channel transistor N4, which acts as a constant current source, by an amount of $\Delta I$. To this end, provided that mutual conductance of the P channel transistor P3 is taken as gm, a gate voltage Vg of the P channel transistor P3 must be made lower by $\Delta I/gm$ when compared with the case where the current $\Delta I$ is not output from the output terminal OUT. In order to make the gate voltage Vg of the P channel transistor P3 lower by $\Delta I/gm$, a drain potential of the N channel transistor N1 must be made lower by $\Delta I/gm$ as compared with a case where the electric current $\Delta I$ is not output from the output terminal OUT, and a drain potential of the N channel transistor N2 must be increased correspondingly. For these reasons, in a state where a negative feedback is sent from the output terminal OUT to the negative input terminal IN− by way of the resistor ra, an input voltage (a feedback voltage) of the negative input terminal IN− of the operational amplifier OP1 does not accurately match an input voltage of the positive input terminal IN+ and turns into a voltage that is lower than an input voltage of the positive input terminal IN+ by an offset voltage equal to the ΔI/gm. Conversely, when the electric current ΔI having a certain magnitude flows from the operational amplifier OP2 to the operational amplifier OP1, an input voltage (the feedback voltage) of the negative input terminal IN− of the operational amplifier OP1 turns into a voltage that has become higher than the input voltage of the positive input terminal IN+ by an offset voltage equal to the current ΔI.

As described above, the voltage Vo acquired from the output terminal OUT of the operational amplifier OP1 comes to a voltage including a difference from the voltage Vo that is expressed by Equation (1) and that exhibits ideal linearity. The problem is not limited to the voltage adder circuit used in the D/A converter circuit, such as that described in JP-A-2001-156640, but also occurs even in a voltage adder circuit used in a circuit other than the D/A converter circuit.

SUMMARY

The present invention has been conceived against such a background and aims at making smaller a difference between computation results provided by a voltage adder circuit in which output terminals of two operational amplifiers are connected together through two resistors.

The present invention provides a voltage adder circuit, comprising:

an amplifier circuit having a first operational amplifier and into which a first voltage is input;

a circuit that supplies an output current to the amplifier circuit, wherein a second voltage is input into the circuit; and a current providing section that detects the output current of the circuit and supplies an output current equal to the output current of the circuit in magnitude so that the output current of the circuit is prevented from inputting to or outputting from the first operational amplifier through an output terminal of the first operational amplifier.

Preferably, the circuit includes a second operational amplifier, the first voltage is applied to a positive input terminal of the first operational amplifier, the second voltage is applied to a positive input terminal of the second operational amplifier, a first resistor and a second resistor are connected in serial and are interposed between output terminals of the first and second operational amplifiers, an negative input terminal of the first operational amplifier is connected to a common node between the first and second resistors, the output terminal of the second operational amplifier is connected to an negative input terminal of the second operational amplifier, and a voltage that is a result of weighted addition of the first voltage and the second voltage is output from the output terminal of the first operational amplifier.

Preferably, the current providing section includes a first transistor which has a gate, a source and a drain, the gate of the first transistor is connected to a gate of a second transistor provided on an output stage of the circuit, the source of the first transistor is connected to a power source, and the drain of the first transistor supplies a current which is same in magnitude as an output current of the second transistor of the circuit.

According to the present invention, there is also provided a D/A converter circuit, comprising:

the voltage adder circuit described above; and a D/A converter that performs D/A conversion of a higher n bits of input data and D/A conversion of one's complement of a lower n bits of the input data to supply results of the D/A conversions to the positive input terminals of the first and second operational amplifiers respectively as the first and second voltages, wherein a resistance ratio of the first resistor and the second resistor is 1 to $(2^n-1)$.

According to the present invention, even when an electric current flows between the operational amplifiers as a result of a voltage difference having occurred between the output terminals of the first and second operational amplifiers, an electric current for canceling the electric current is supplied to the output terminal of the first operational amplifier by the current providing section. Accordingly, an input offset attributable to the electric current flowing between the first and second operational amplifiers does not occur between the positive input terminal and the negative input terminal of the first operational amplifier. Therefore, a difference between operation results can be reduced.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

An embodiment of the present invention is hereunder described by reference to the drawings.

Figure 1:
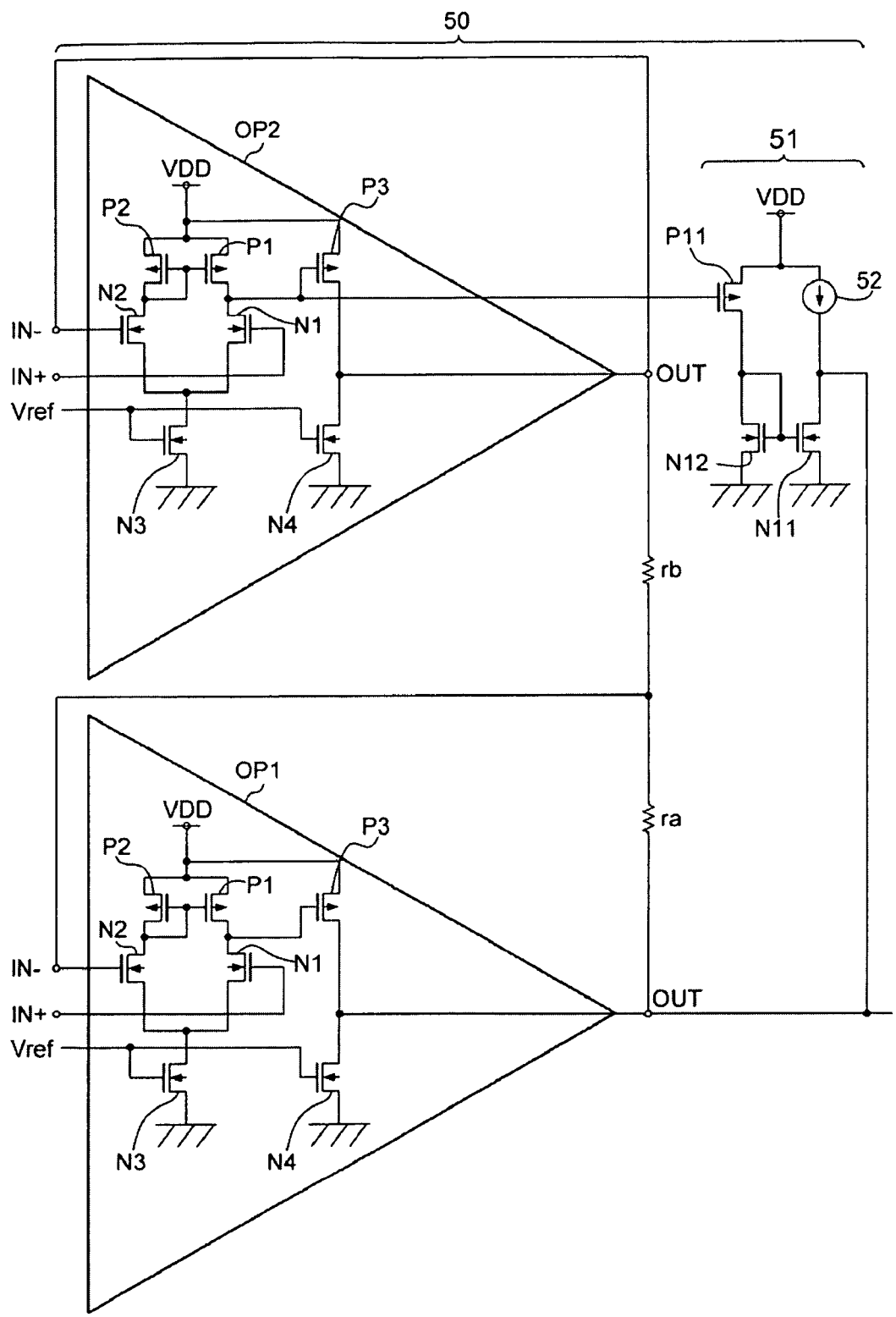
FIG. 1 is a view showing a configuration of a voltage adder circuit according to an embodiment of the present invention.

FIG. 1 is a view showing a configuration of a voltage adder circuit 50 according to an embodiment of the present invention. The voltage adder circuit 50 subjects voltages Va and Vb given by a circuit on a preceding stage to weighted addition expressed by Equation (1) and outputs a voltage Vo which is a result of weighted addition. The voltage adder circuit 50 includes two operational amplifiers OP1 and OP2, two resistors ra and rb, and a current supply section 51.

Figure 3A:
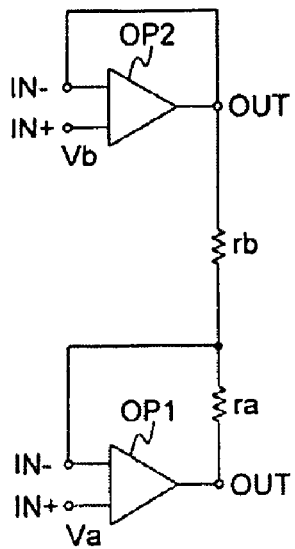
FIGS. 3A and 3B are views showing a related voltage adder circuit and an internal configuration of an operational amplifier included in the voltage adder circuit.
Figure 3B:
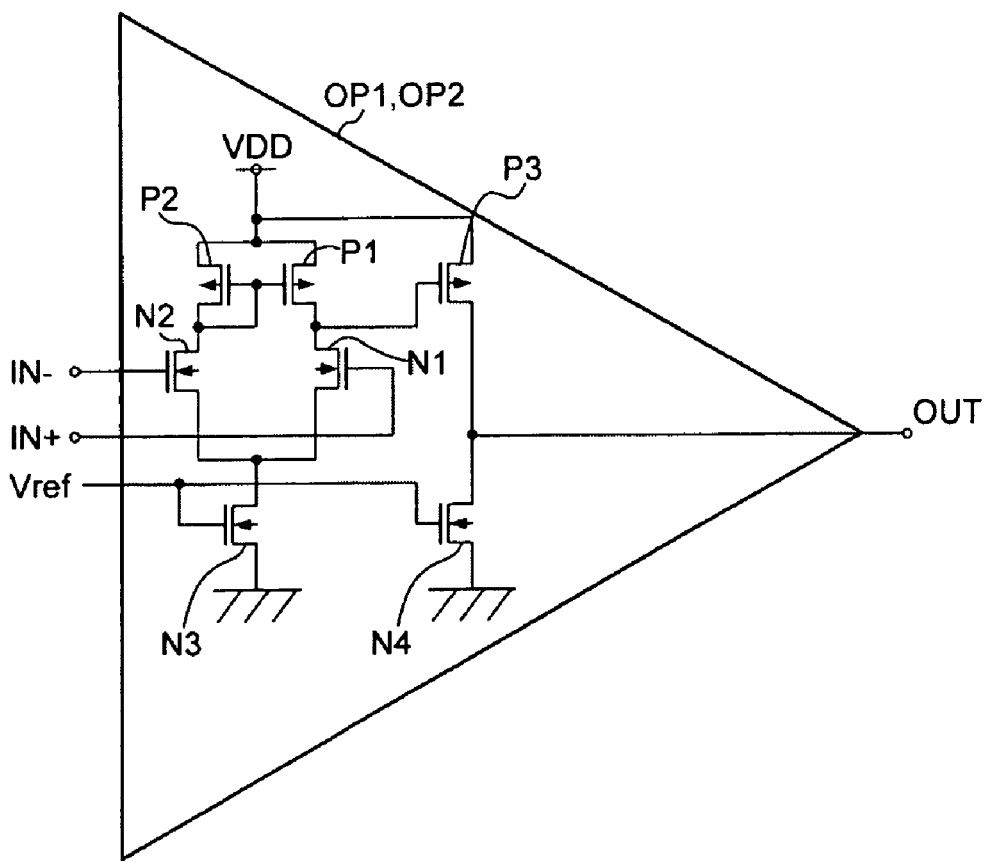

In the voltage adder circuit 50, the voltage Va is input to a positive input terminal IN+ of the operational amplifier OP1, and the voltage Vb is input to a positive input terminal IN+ of the operational amplifier OP2. An output terminal OUT of the operational amplifier OP1 and an output terminal OUT of the operational amplifier OP2 are connected through resistors ra and rb. A resistance ratio of the resistor ra to the resistor rb is 1 to $(2^n-1)$. The output terminal OUT of the operational amplifier OP1 is connected to a negative input terminal IN− of the operational amplifier OP1 through the resistor ra. The output terminal OUT of the operational amplifier OP2 is connected to a negative input terminal IN− of the operational amplifier OP2 without a resistor. Internal configurations of the operational amplifiers OP1 and OP2 are identical with those of the operational amplifiers in the related voltage adder circuit (see FIG. 3B).

The current supply section 51 generates an electric current, which has the same magnitude as an electric current output from the operational amplifier OP2 and which has an opposite electric polarity, and supplies the electric current to the output terminal OUT of the operational amplifier OP1. The current supply section 51 has a P channel transistor P11, N channel transistors N11 and N12, and a constant current source 52. The P channel transistor P11 has the same size (a channel width/a channel length) as that of a P channel transistor P3 in the operational amplifier OP2, and the N channel transistors N11 and N12 have the same size.

A source of the P channel transistor P11 is connected to a power source VDD. A gate of the P channel transistor P11 is connected to a gate of the P channel transistor P3 in the operational amplifier OP2. Therefore, a drain current that has the same magnitude as that of a drain current of the P channel transistor P3 in the operational amplifier OP2 flows into the P channel transistor P11. A source of the N channel transistor N12 is connected to a ground. A drain and a gate of the N channel transistor N12 are connected to a drain of the P channel transistor P11. A drain current of the P channel transistor P11 flows into the N channel transistor N12. A source of the N channel transistor N11 is connected to the ground, and a gate of the N channel transistor N11 is given a gate voltage which is the same in magnitude as the gate voltage applied to the gate of the N channel transistor N12. Specifically, the N transistor N11 and the N channel transistor N12 configure a current mirror. The constant current source 52 is interposed between the drain of the N channel transistor N11 and the power source VDD. The constant current source 52 flows an electric current Ire which has the same magnitude as that of a drain current of the N channel transistor N4 operating as the constant current source in the operational amplifier OP2. A node between the constant current source 52 and the drain of the N channel transistor N11 is connected to the output terminal OUT of the operational amplifier OP1.

For instance, it is assumed that an output voltage of the operational amplifier OP2 is larger than an output voltage of the operational amplifier OP1 and that an electric current $\Delta$I flows from the operational amplifier OP2 to the operational amplifier OP1 through the resistors rb and ra. In this case, in the operational amplifier OP2, a drain current of the P channel transistor P3 has become larger than the electric current Iref flowing through the N channel transistor N4 by an amount equal to $\Delta$I. The difference; namely, the current $\Delta$I, flows outside toward the operational amplifier OP1 through the output terminal OUT of the operational amplifier OP2 from a node between the drain of the P channel transistor P3 and the drain of the N channel transistor N4. Meanwhile, the P channel transistor P11 in the current supply section 51 and the P channel transistor P3 in the operational amplifier OP2 configure a current mirror. Accordingly, a drain current Iref$\Delta$I flows into the P channel transistor P11, and also the drain current Iref+$\Delta$I flows into the N channel transistor N12. As a consequence, the N channel transistor N11 making up a current mirror along with the N channel transistor N12 also acts as a constant current source that lets flow the drain current Iref+$\Delta$I. However, the constant current source 52 connected to the drain of the N channel transistor N11 is a constant current source that lets the electric current Iref flow. Therefore, a deficient current Iref+$\Delta$I−Iref=$\Delta$I flows into the N channel transistor N11 from the output terminal OUT of the operational amplifier OP1.

The electric current $\Delta$I flows from the output terminal OUT of the operational amplifier OP2 to the output terminal OUT of the operational amplifier OP1 through the resistors ra and rb. In the meantime, the same electric current $\Delta$I flows from the output terminal OUT of the operational amplifier OP1 to the N channel transistor N11 of the current supply section 51. Accordingly, the electric current $\Delta$I does not flow into the N channel transistor N4 of the operational amplifier OP1, so that the input offset does not occur in the operational amplifier OP1.

Conversely, the voltage output from the operational amplifier OP2 is assumed to be smaller than the voltage output from the operational amplifier OP1, and the electric current $\Delta$I is assumed to flow from the operational amplifier OP1 to the operational amplifier OP2 through the resistors ra and rb. In this case, in the operational amplifier OP2, the drain current of the P channel transistor P3 is smaller than the electric current Iref flowing through the N channel transistor N4 by $\Delta$I. The electric current Iref−$\Delta$I+$\Delta$I=Iref, which is a combination of the drain current Iref−$\Delta$I of the P channel transistor P3 with the electric current $\Delta$I supplied from the operational amplifier OP1 flows into the N channel transistor N4 that is a constant current source. On the other hand, the P channel transistor P11 in the current supply section 51 makes up a current mirror along with the P channel transistor P3 in the operational amplifier OP1. Accordingly, the drain current Iref−$\Delta$I flows into the P channel transistor P11, and the drain current Iref−$\Delta$I flows into the N channel transistor N12. As a consequence, the N channel transistor N11 that makes up the current mirror along with the N channel transistor N12 also serves as a constant current source that lets the drain current Iref−$\Delta$I flow. However, the constant current source 52 connected to the drain of the N channel transistor N11 is a constant current source that lets the electric current Iref flow. Accordingly, an excessive electric current Iref−(Iref−$\Delta$I)=$\Delta$I flows from the current supply section 51 to the output terminal OUT of the operational amplifier OP1.

The electric current $\Delta$I flows out from the output terminal OUT of the operational amplifier OP1 to the output terminal OUT of the operational amplifier OP2 through the resistors ra and rb. In the meantime, the same electric current $\Delta$I flows from the current supply section 51 to the output terminal OUT of the operational amplifier OP1. Accordingly, the electric current $\Delta$I does not flow from the P channel transistor P3 of the operational amplifier OP1, and hence an input offset does not occur in the operational amplifier OP1.

As mentioned above, according to the present embodiment, when the electric current $\Delta$I flows between the operational amplifiers OP1 and OP2 through the resistors rb and ra in a situation that the output voltages of the operational amplifiers OP1 and OP2 differ from each other, an electric current −$\Delta$I having the same magnitude and an opposite electric polarity is supplied from the current supply section 51 to the output terminal OUT of the operational amplifier OP1. Accordingly, occurrence of the input offset in the operational amplifier OP1, which would otherwise be attributable to the electric current $\Delta$I, is prevented. Further, it is possible to prevent occurrence of a difference, which would be caused by the input offset, in the output voltage Vo that is obtained from the operational amplifier OP1 and that corresponds to results of weighted addition.

Figure 2:
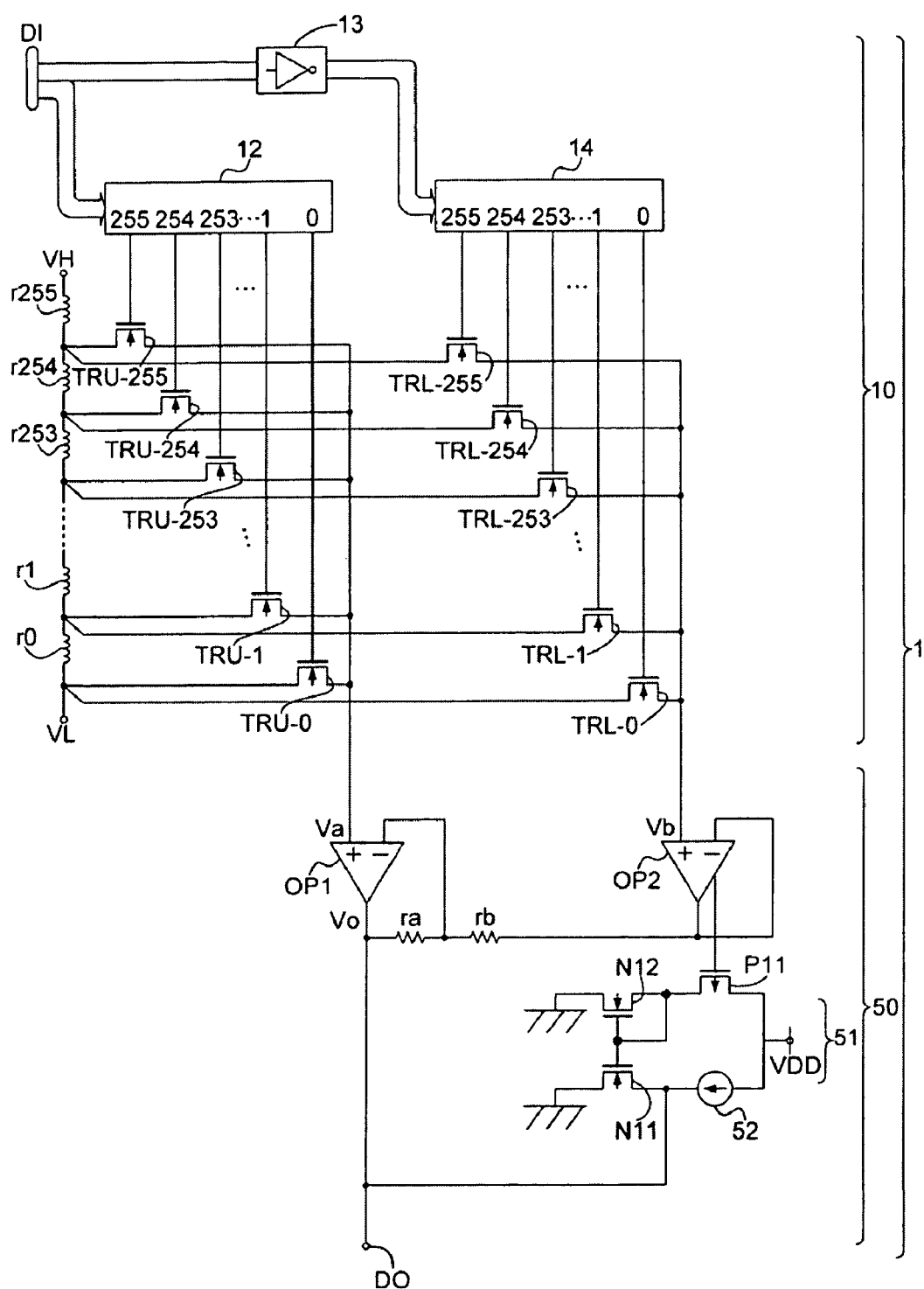
FIG. 2 is a view showing a configuration of a D/A converter circuit provided with the voltage adder circuit.

The above is a detailed configuration of the voltage adder circuit 50. An embodiment of the D/A converter circuit utilizing the voltage adder circuit 50 of the embodiment is now described by reference to FIG. 2. As shown in FIG. 2, the voltage adder circuit 50 and a D/A converter 10 configure a D/A converter circuit 1. The D/A converter 10 performs D/A conversion of 2n-bit (e.g., n=8) input data while dividing the data into higher eight bits and lower eight bits. In an example configuration shown in FIG. 2, the D/A converter 10 performs D/A conversion of the higher eight bits of the input data and D/A conversion of one's complement of the lower eight bits and provides the voltage adder circuit 50 with respective conversion results as the voltages Va and Vb. In the example configuration, a resistance ratio of the resistor ra to the resistor rb in the voltage adder circuit 50 is taken as 1 to ($2^8$−1=255). The voltage adder circuit 50 subjects the voltages Va and Vb given by the D/A converter 10 to weighted addition expressed by Equation (1) (where n=8).

In FIG. 2, the higher eight bits of the input data applied to the input terminal DI are applied to a decoder 12, and the lower eight bits are applied to an inverter circuit 13. The inverter circuit 13 inverts each of the input lower eight bits and outputs an inversion result to the decoder 14.

Reference numerals r0 to r255 designate resistors that are series connected and that have the same resistance value. Of the resistors r0 to r255, one end of the resistor r255 is connected to a high-potential-side power source VH, and one end of the resistor r0 is connected to a low-potential-side power source VL. Reference numerals TRU-0 to TRU-255 are N channel transistors whose on-off controls are performed by outputs from the decoder 12. Sources of the respective N channel transistors TRU-0 to TRU-255 are connected to nodes of the resistors r0 to r255, and drains of the respective N channel transistors TRU-0 to TRU-255 are commonly connected together. A common node of the respective drains of the N channel transistors TRU-0 to TRU-255 is connected to the positive input terminal IN+ of the operational amplifier OP1.

The transistors TRL-0 to TRL-255 are N channel transistors whose on-off controls are performed by outputs from the decoder 14. Sources of the respective N channel transistors TRL-0 to TRL-255 are connected to the respective nodes of the resistors r0 to r255, and respective drains of the N channel transistors are commonly connected. A common node of the drains of the N channel transistors TRL-0 to TRL-255 is connected to the positive input terminal IN+ of the operational amplifier OP2.

In such a configuration, when the input data are; for instance, "0000000000000000," the decoder 12 that decodes higher eight bits of the input data turns on the N channel transistor TRU-0. A voltage VL of the low-potential-side power source VL is supplied to the positive input terminal IN+ of the operational amplifier OP1. In the meantime, the decoder 14 that decodes the lower eight bits of the input data turns on the N channel transistor TRL-255. A voltage (VL+255 v) (v: voltage drops of the respective resistors r0 to r255) of the node between the resistor r255 and the resistor r254 is input to the positive input terminal IN+ of the operational amplifier OP2. In this case, the voltages Va and Vb are defined as follows.

$$Va = VL$$

$$Vb = VL + 255\,v.$$

These values are substituted into Equation (1) (where n=8)

$$Vo = (256/255)VL - (1/255)(VL + 255v)$$

$$= VL - v$$

An operation result Vo is yielded. The operation result Vo is supplied from the output terminal OUT of the operational amplifier OP1 to an output terminal DO. Likewise, when input data are "0000000000000001" to "1111111111111111," operation results Vo, such as those provided in the following table, are yielded.

| INPUT DATA | Va | Vb | Vo |
|---|---|---|---|
| 0000000000000001 | VL | VL + 254v | VL − (254/255)v |
| 0000000000000010 | VL | VL + 253v | VL − (253/255)v |
| . | . | . | . |
| . | . | . | . |
| . | . | . | . |
| 1111111111111110 | VL + 255v | VL + v | VH − (1/255)v |
| 1111111111111111 | VL + 255v | VL | VH |

As mentioned above, in the present embodiment, even when an electric current flows between the operational amplifiers OP1 and OP2 as a result of a voltage difference occurring between the output terminals OUT of the operational amplifiers OP1 and OP2 in the voltage adder circuit 50, an input offset voltage will not occur between the positive input terminal IN+ and the negative input terminal IN− of each of the operational amplifiers OP1 and OP2. Therefore, a difference in the operation result of the voltage adder circuit 50 can be reduced.

Another Embodiment

Although the embodiment of the present invention has thus been described, various other embodiments of the present invention are also conceivable. For instance, in the present embodiment, the voltage adder circuit 50 makes up the D/A converter circuit 1 by use of the D/A converter 10 of a resistor string type. However, the voltage adder circuit 50 can also make up the D/A converter circuit by use of another type of D/A converter, such as a D/A converter of a resistor ladder type, a D/A converter of a current output type, and a D/A converter of a delta sigma type.

Also, the current providing section 51 of the embodiment may be provided in an electric volume circuit. In this case, the current providing section 51 detects an output current of a preceding stage of the electric volume circuit which flows into or out from the electric volume circuit, and controls to supply a current equal to the output current of the preceding stage in magnitude so that the output current of the preceding stage is prevented from inputting to or outputting from an operational amplifier in the electric volume circuit.

By this configuration, an input offset voltage does not occur in the operational amplifier in the electric voltage circuit. Therefore, the electric volume circuit can sufficiently attenuate with high resolution.

As a specific example, a voltage adder circuit which is different from the voltage adder circuit 50 of the embodiment in that the resistors ra, rb are replaced with a ladder resistor circuit and a decoder circuit is added, is provided. The decoder circuit controls an attenuation of the voltage adder circuit by selecting any one of a plurality of resistor taps in the ladder resistor circuit. The electric volume circuit is configured by the ladder resistor circuit, the decoder circuit and the operational amplifier OP1. The operational amplifier OP2 is configured as a preceding circuit (buffer circuit) of the electric volume circuit. Also, the current providing section 51 is applied to the voltage adder circuit 50, an input signal is input to the positive input terminal IN+ of the operational amplifier OP2, and an input signal input to the positive input terminal IN+ of the operational amplifier OP1 is grounded or fixed to a reference voltage.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-285063 filed on Dec. 16, 2009, the contents of which are incorporated herein by reference.

What is claimed is:

1. A voltage adder circuit, comprising:
   an amplifier circuit having a first operational amplifier and into which a first voltage is input;
   a circuit that supplies an output current to the amplifier circuit, wherein a second voltage is input into the circuit; and
   a current providing section that detects the output current of the circuit and supplies an output current equal to the output current of the circuit in magnitude so that the output current of the circuit is prevented from inputting to or outputting from the first operational amplifier through an output terminal of the first operational amplifier.

2. The voltage adder circuit according to claim 1, wherein the circuit is includes a second operational amplifier;
   wherein the first voltage is applied to a positive input terminal of the first operational amplifier;
   wherein the second voltage is applied to a positive input terminal of the second operational amplifier;
   wherein a first resistor and a second resistor are connected in serial and are interposed between output terminals of the first and second operational amplifiers;
   wherein a negative input terminal of the first operational amplifier is connected to a common node between the first and second resistors;
   wherein the output terminal of the second operational amplifier is connected to an negative input terminal of the second operational amplifier; and
   wherein a voltage that is a result of weighted addition of the first voltage and the second voltage is output from the output terminal of the first operational amplifier.

3. The voltage adder circuit according to claim 1, wherein the current providing section includes a first transistor which has a gate, a source and a drain;
   wherein the gate of the first transistor is connected to a gate of a second transistor provided on an output stage of the circuit;
   wherein the source of the first transistor is connected to a power source; and
   wherein the drain of the first transistor supplies a current which is same in magnitude as an output current of the second transistor of the circuit.

4. A D/A converter circuit, comprising:
   the voltage adder circuit according to claim 2; and
   a D/A converter that performs D/A conversion of a higher n bits of input data and D/A conversion of one's complement of a lower n bits of the input data to supply results of the D/A conversions to the positive input terminals of the first and second operational amplifiers respectively as the first and second voltages,
   wherein a resistance ratio of the first resistor and the second resistor is 1 to $(2^n-1)$.

* * * * *